United States Patent
Pendharkar et al.

(10) Patent No.: US 8,129,814 B2
(45) Date of Patent: Mar. 6, 2012

(54) SCHOTTKY DIODE WITH SILICIDE ANODE AND ANODE-ENCIRCLING P-TYPE DOPED REGION

(75) Inventors: Sameer Prakash Pendharkar, Allen, TX (US); Eugen Pompiliu Mindricelu, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/085,102

(22) Filed: Apr. 12, 2011

(65) Prior Publication Data
US 2011/0186933 A1   Aug. 4, 2011

Related U.S. Application Data

(62) Division of application No. 12/023,190, filed on Jan. 31, 2008, now Pat. No. 7,943,472.

(51) Int. Cl.
*H01L 27/095* (2006.01)
*H01L 29/792* (2006.01)

(52) U.S. Cl. . 257/476; 257/379; 257/471; 257/E21.351; 257/E21.352; 257/E21.359; 257/E21.04; 438/237; 438/238; 438/379; 438/381; 438/414; 438/473

(58) Field of Classification Search .......... 257/379, 257/471, 476, E21.351, E21.352, E21.359, 257/E21.04; 438/237, 238, 379, 381, 414, 473

See application file for complete search history.

(56) References Cited

U.S. PATENT DOCUMENTS

| | | | |
|---|---|---|---|
| 5,899,714 A * | 5/1999 | Farrenkopf et al. | 438/202 |
| 6,633,071 B1 * | 10/2003 | Furio | 257/383 |
| 6,882,029 B1 | 4/2005 | Gau et al. | |
| 6,949,440 B2 * | 9/2005 | Gau | 438/379 |
| 2006/0043476 A1 * | 3/2006 | Kao | 257/336 |
| 2006/0244050 A1 * | 11/2006 | Sudou | 257/324 |
| 2007/0293001 A1 * | 12/2007 | Wu | 438/197 |
| 2010/0279483 A1 | 11/2010 | Collins et al. | |

* cited by examiner

*Primary Examiner* — Dao H Nguyen
(74) *Attorney, Agent, or Firm* — John R. Pessetto; W. James Brady; Frederick J. Telecky, Jr.

(57) ABSTRACT

An integrated circuit includes a Schottky diode having a cathode defined by an n-type semiconductor region, an anode defined by a cobalt silicide region, and a p-type region laterally annularly encircling the cobalt silicide region. The resulting p-n junction forms a depletion region under the Schottky junction that reduces leakage current through the Schottky diodes in reverse bias operation. An n+-type contact region is laterally separated by the p-type region from the first silicide region and a second cobalt silicide region is formed in the n-type contact region. The silicided regions are defined by openings in a silicon blocking dielectric layer. Dielectric material is left over the p-type region. The p-type region may be formed simultaneously with source/drain regions of a PMOS transistor.

5 Claims, 6 Drawing Sheets

SCHOTTKY DIODE WITH SILICIDE ANODE AND ANODE-ENCIRCLING P-TYPE DOPED REGION

This application is a division of application Ser. No. 12/023,190, filed Jan. 31, 2008, the entirety of which is hereby incorporated by reference.

BACKGROUND

This invention relates to the field of integrated circuits. More particularly, this invention relates to integrated circuits using cobalt silicide ($CoSi_2$) on silicon Schottky diodes.

Schottky diodes are used in electronic circuits to provide low voltage drops in forward biased operation and low leakage currents in reverse biased operation. The current art integrates cobalt silicide on silicon Schottky diodes into the BiCMOS fabrication process. Cobalt silicide Schottky diodes are fabricated by forming cobalt silicide in a region on the surface of a lightly doped n-type silicon layer. The current-voltage relationship of current art $CoSi_2$ Schottky diodes is degraded by generation-recombination sites in the silicon under the Schottky junction. The current art Schottky diodes exhibit higher leakage current in reverse bias operation than comparable diodes with no generation-recombination sites. Leakage current in reverse bias operation is undesirable in most circuit applications.

SUMMARY

An integrated circuit diode is formed of an n-type cathode, a metal silicide anode, and a floating p-type region encircling the anode. A plurality of such diodes with similar surrounding p-type regions may be connected in parallel to increase current carrying capacity. The p-type regions can be incorporated into an integrated circuit without adding additional steps to the fabrication process.

DETAILED DESCRIPTION OF EXAMPLE EMBODIMENTS

Figure 1:
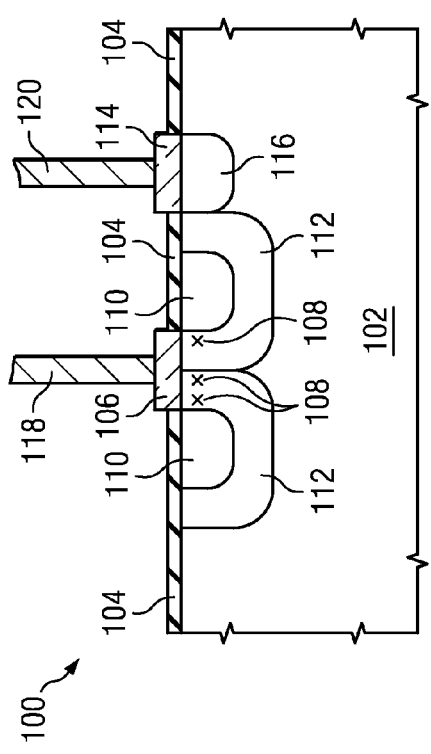
FIG. 1 is a section view of a Schottky diode according to an embodiment of the invention.

FIG. 1 illustrates an integrated circuit diode comprising an anode, a cathode and a p-type region laterally encircling the anode according to an embodiment of the invention. An integrated circuit 100 formed on a semiconductor substrate contains an n-type region 102. A silicide blocking dielectric layer 104, typically comprising silicon nitride, is formed on a surface of the n-type region 102, and patterned to define regions for metal silicide formation in a later process step. An integrated circuit diode of this invention is fabricated in the integrated circuit 100 by forming a cobalt silicide ($CoSi_2$) region 106 in a region of the n-type region 102 defined by an opening in the dielectric layer 104. The $CoSi_2$ region 106 comprises an anode of the integrated circuit diode, and the n-type region adjacent to the $CoSi_2$ region 106 comprises a cathode of the diode, also known as a Schottky diode. Forming $CoSi_2$ in the anode region generates sites 108 in the cathode region that generate leakage current when the diode is operated in reverse bias.

In a first embodiment, a ring-shaped shallow p-type region 110 is formed at the surface in the n-type region 102 in the integrated circuit substrate to laterally encircle the anode. In another embodiment, the p-type region is formed by fabrication process steps used to form other elements in the integrated circuit 100. In yet another embodiment, the p-type region is formed by fabrication process steps used to form source and drain regions for PMOS transistors in the integrated circuit 100.

Depletion regions 112 form in the n-type region 102 around the p-type regions 110 and under the region 106. This is advantageous because the depletion regions remove charge generated by sites 108 and thus reduce current through the Schottky diode when it is operated in reverse bias. Metal silicide is prevented from forming in a surface region of the p-type region by the silicide blocking dielectric 104, causing the p-type region 110 to be uncontacted by subsequently formed interconnect contacts; the attribute of being uncontacted by interconnects is known as floating.

Still referring to FIG. 1, $CoSi_2$ is also formed in a region 114 in an n-type region in the cathode region 102 with higher n-type doping 116 than the n-type cathode region 102, defined by an opening in the dielectric layer 104 laterally spaced from the region 106 beyond the region 112. The $CoSi_2$ region 114 contacting an n-type region with higher n-type doping 116 than the n-type region 102 forms an electrical connection to the cathode 102. A metal contact 118 is formed contacting the Schottky diode anode 106 and a metal contact 120 is formed contacting the $CoSi_2$ region 114 connecting to the Schottky diode cathode, for the purpose of connecting the Schottky diode to electrical circuits in the integrated circuit 100.

FIGS. 2A-2E illustrate steps in the fabrication of a Schottky diode embodying the invention, implemented on an integrated circuit 200 containing MOS transistors.

Integrated circuit 200 comprises a semiconductor substrate 202 comprising silicon in which are formed an n-type cathode region 204, an n-type region 206 known as an n-well, and a p-type region 208 known as a p-well. Regions 204, 206, 208 are isolated by field oxide structures 210, typically comprising silicon dioxide, and formed by local oxidation of silicon (LOCOS) or shallow trench isolation (STI). A partially formed NMOS transistor 212, comprising a gate structure 214 and source/drain regions 216, is formed in p-well 208. Similarly, a partially formed PMOS transistor 218, comprising gate structure 220, source/drain extension regions 222 and source/drain regions 234, is fabricated in n-well 206. An n-type region 224 is formed in the n-type cathode region 204 wherein a doping density in the n-type region 224 is higher than in the n-type cathode region 204.

Figure 2B:
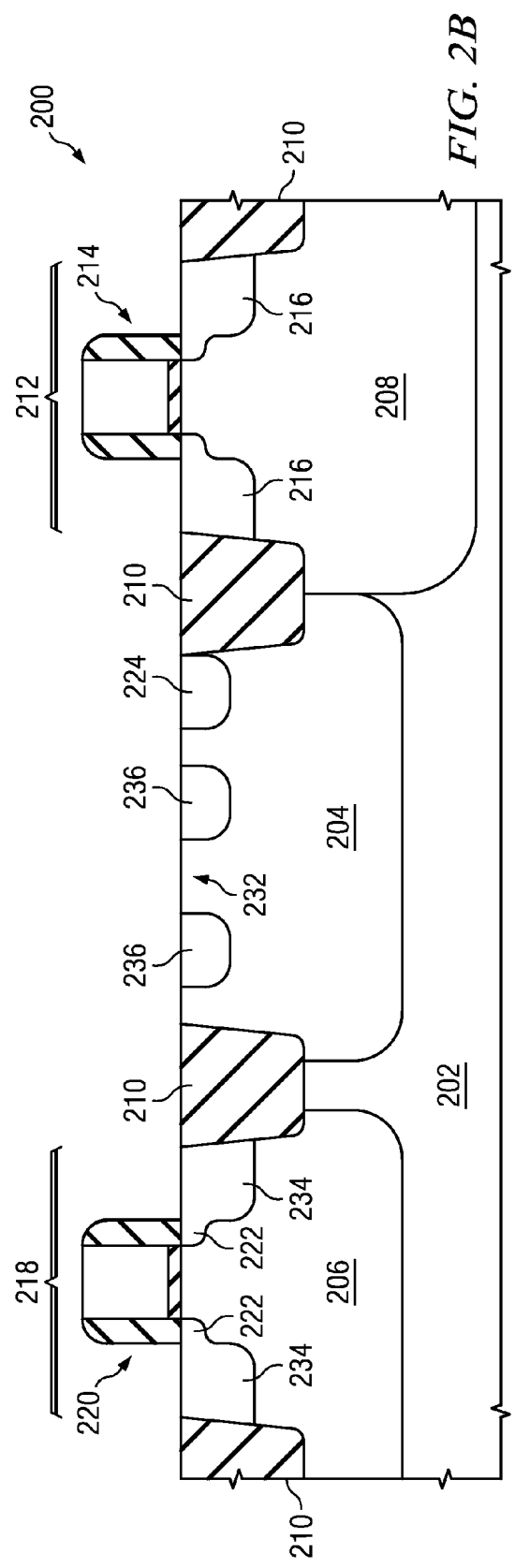
FIGS. 2A-2E are section views of steps in the fabrication of a Schottky diode embodying the invention, implemented in an integrated circuit also including MOS transistors.
Figure 2A:
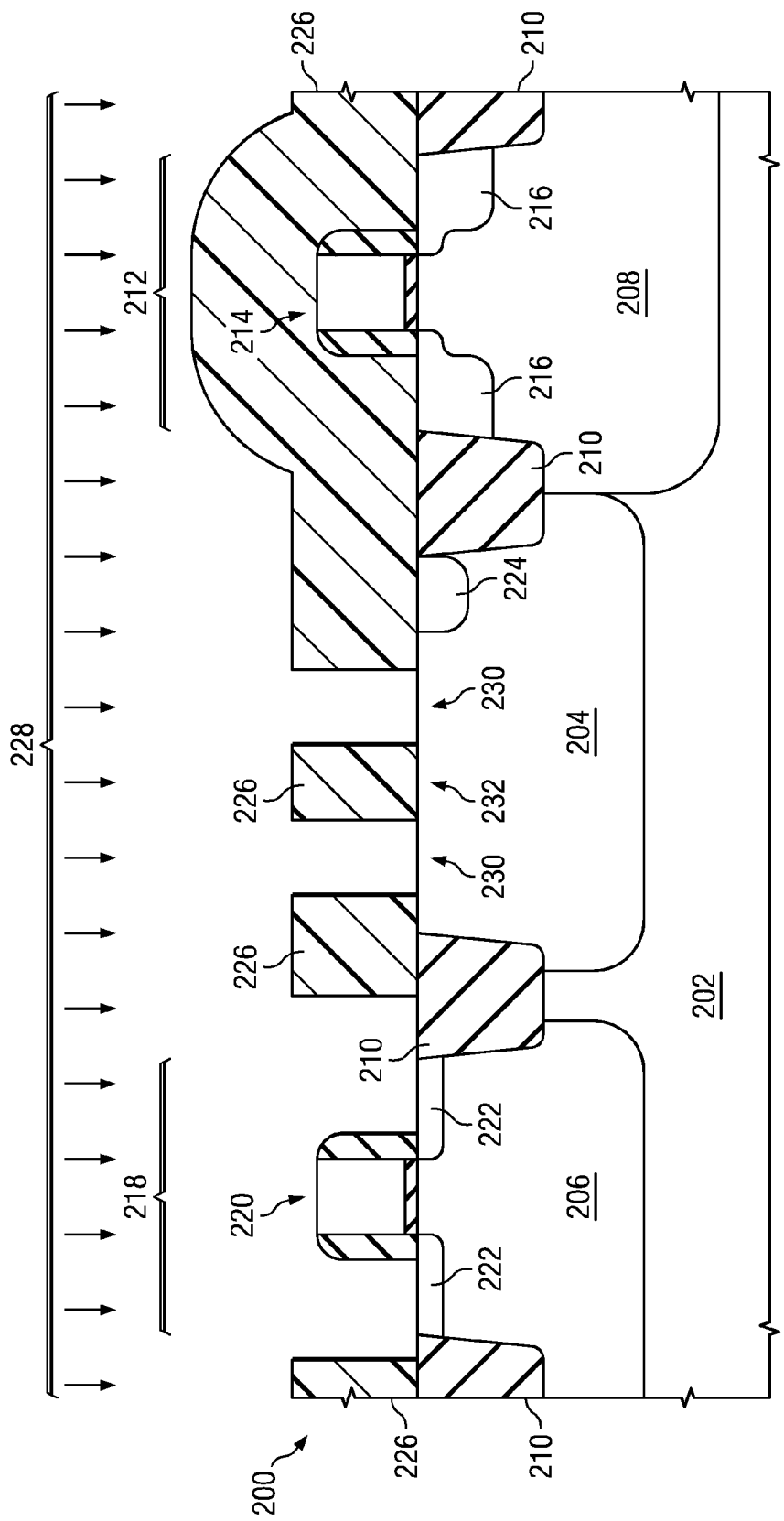

Referring to FIG. 2A, regions for implanting a p-type dopant species are defined by a photoresist layer 226 generated by known photolithographic techniques. A p-type dopant species 228 is implanted using known techniques into open regions in the photoresist layer 226, including gate structure 220 and portions of source/drain extension regions 222 of the PMOS transistor 218 and a ring-shaped region 230 laterally annularly encircling a region 232 in which in subsequent steps an anode of a Schottky diode will be formed.

FIG. 2B shows the same structure 200 following implantation and after removal of the patterned photoresist layer 226. The implanted p-type dopant species forms the ring-shaped p-type region 236 laterally annularly encircling the region 230 in which the anode of the Schottky diode will be formed. The implanted p-type dopant species also forms the source/drain regions 234 of the PMOS transistor 218.

Figure 2C:
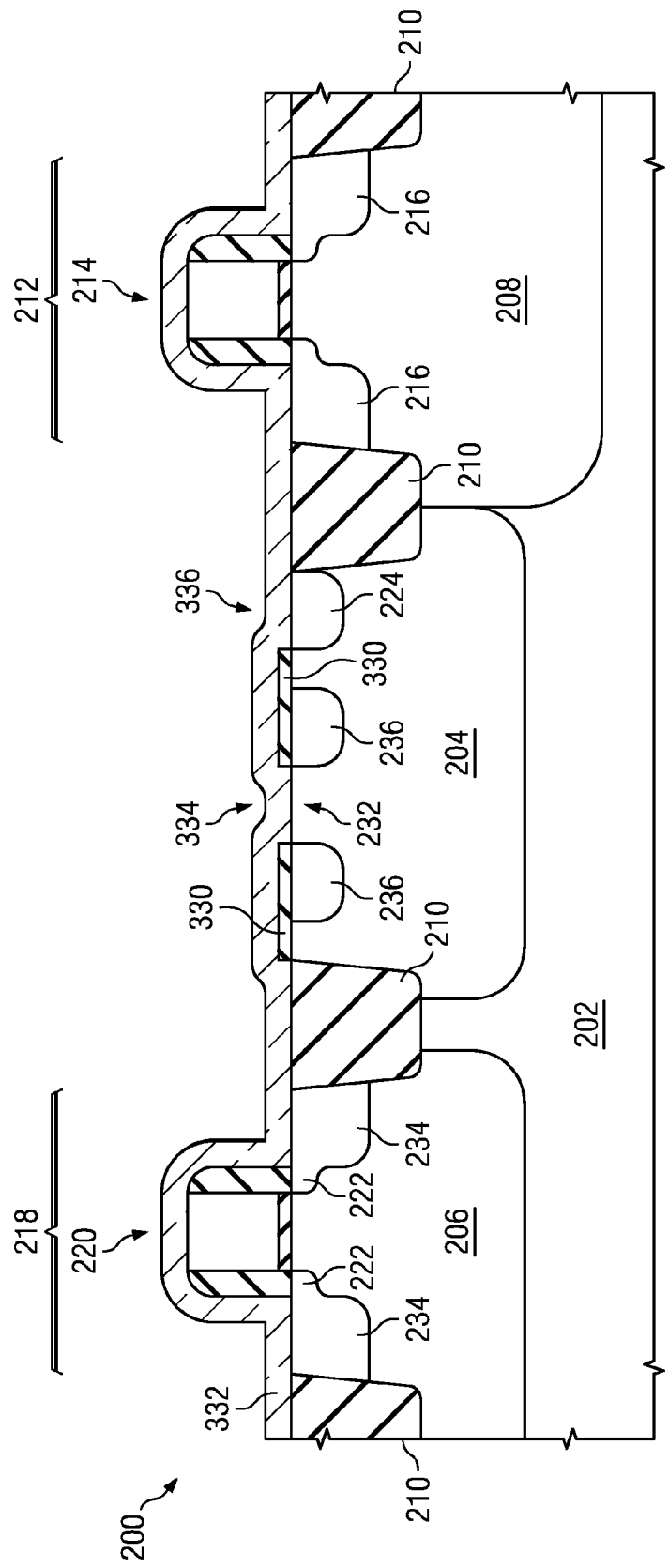
Figure 2D:
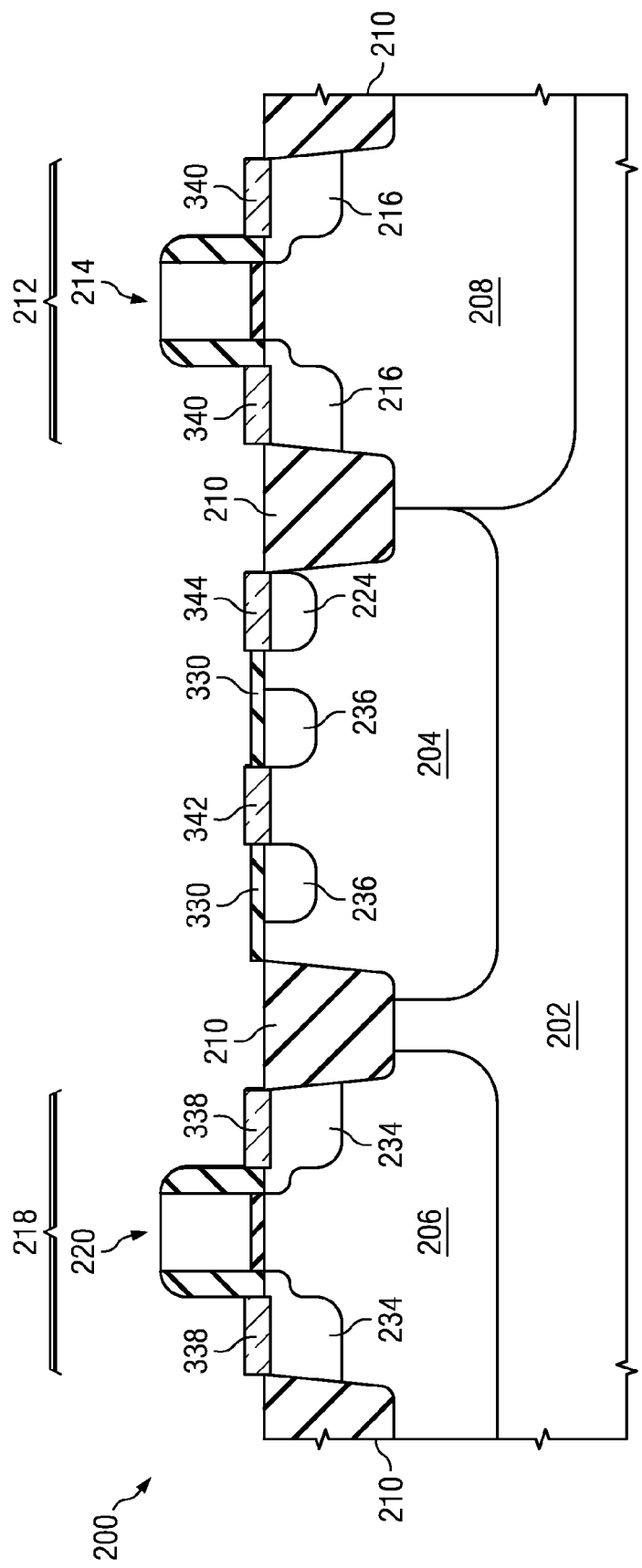

FIGS. 2C and 2D illustrate the integrated circuit 200 during a metal silicide formation operation of the fabrication process.

FIG. 2C shows the p-type region 236 formed to encircle the region 232 in which the anode will be formed and the n-type region 224 formed with a higher n-type doping than the doping in the n-type cathode region 204. A silicide blocking dielectric layer 330 has been formed on a top surface of the substrate 202 over the n-type region 204 and patterned, using known photolithographic and etching techniques, to define regions on a surface of the n-type cathode region 304 in which metal silicide will be prevented from forming. A silicide formation layer 332 of material typically including cobalt is deposited on the top surface of the substrate 202 over the patterned silicide blocking dielectric layer 330, in preparation for forming metal silicide in regions where silicide formation layer 332 contacts silicon, for example in the gate and source/drain regions of the transistors 212, 218, in the anode region 334 (corresponding to encircled region 232) of the Schottky diode, in contact region 336 in n-type cathode region 224, and in source/drain contact regions in n-well 206 and p-well 208. In regions where silicide formation layer 332 makes direct contact with silicon in a top surface layer of the substrate, metal silicide is formed. After formation of metal silicide, unwanted residue of silicide formation layer 332 is removed.

FIG. 2D illustrates the integrated circuit 200 after removal of the unwanted residue of the silicide formation layer 332. As shown, metal silicide, typically $CoSi_2$, has been formed in source/drain silicide regions 338 of n-well 206 of PMOS transistor 218, in source/drain silicide regions 340 of p-well 208 of NMOS transistor 212, in the anode silicide region 342 of the Schottky diode, and in the contact silicide region 344 in the more heavily doped n-type cathode connection region 224. Because the p-type region 236 was covered with the silicide blocking dielectric layer 330, metal silicide is not formed in contact with the p-type region 236 encircling the anode 342 of the Schottky diode.

Figure 2E:
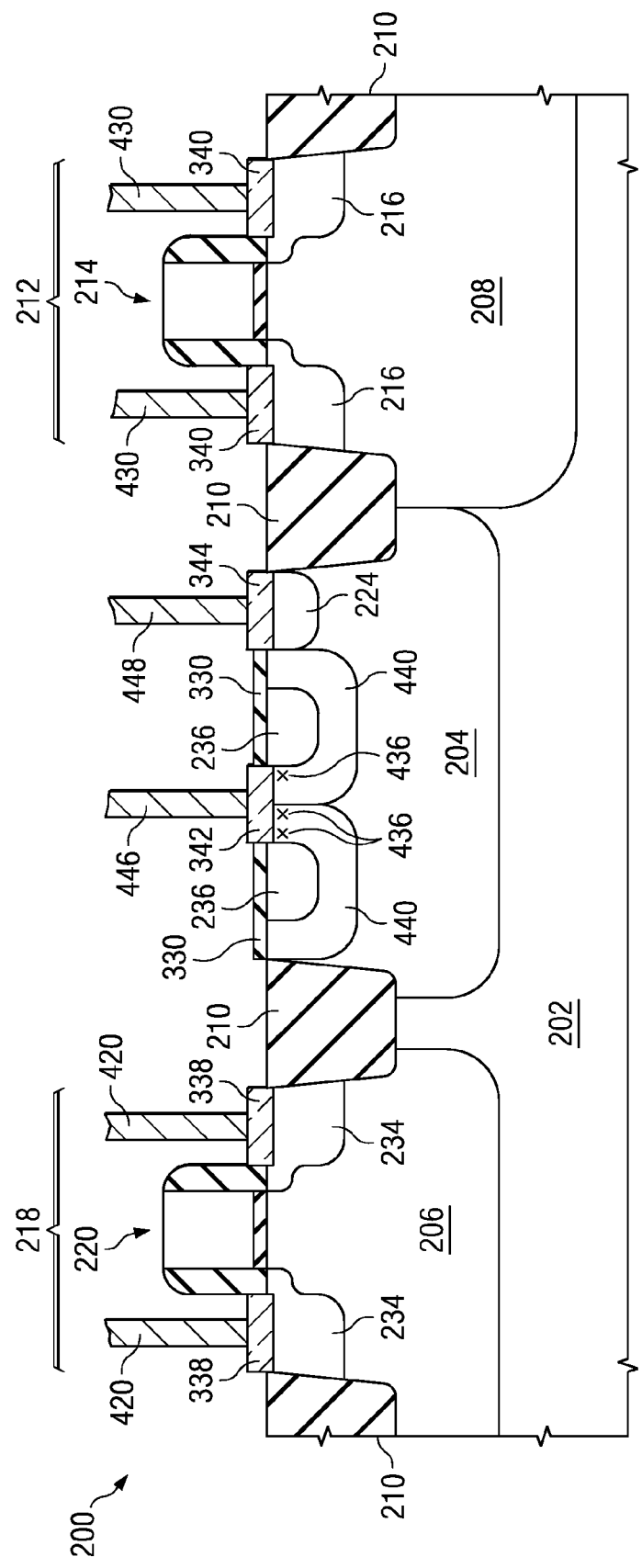

FIG. 2E illustrates the integrated circuit 200 after the formation of metal contacts. Contact vias 420 are formed to provide electrical contact to the respective metal silicide regions 338 of the PMOS transistor 218. Contact vias 430 are formed to provide electrical contact to the respective metal silicide regions 340 of the NMOS transistor 212. A metal contact 446 is formed to provide electrical contact to the $CoSi_2$ silicide region 312 defining the Schottky diode anode and a metal contact 448 is formed to provide electrical contact to the silicide region 344 connecting to the Schottky diode cathode, the contacts 446, 448 serving to connect the Schottky diode to other electrical circuits in the integrated circuit 200.

The silicide blocking dielectric layer 330, typically comprising silicon nitride, is formed on the surface of the n-type cathode region 204, and patterned to define the regions for metal silicide formation. In the illustrated structure, the cobalt silicide ($CoSi_2$) region 342 is formed in a surface region of the n-type cathode region 204 defined by a first opening in the silicide blocking dielectric layer 432. The $CoSi_2$ region 342 defines the anode of the Schottky diode, and portions of the n-type region 204 adjacent to and below the $CoSi_2$ region 342 define the cathode of the diode. Forming $CoSi_2$ in the anode region creates sites 436 (FIG. 2E) in the cathode region that generate leakage current when the diode is operated in reverse bias. The p-type region 236 is formed in the substrate to laterally annularly encircle the anode 342. The p-type region 236 may be formed by fabrication process steps used to form other elements in the integrated circuit 200 such as, for example, by fabrication process steps used to form the p-type source/drain regions 234 for the PMOS transistor 218 in the integrated circuit 200. Depletion regions 440 form around and underneath the p-type region 236. As discussed above, this is advantageous because the depletion regions remove charge generated by sites 436 and thus reduce current through the Schottky diode when it is operated in reverse bias. Metal silicide is prevented from forming in a surface region of the p-type region 236 by the silicide blocking dielectric layer 330, causing the p-type region 236 to be floating.

Figure 3:
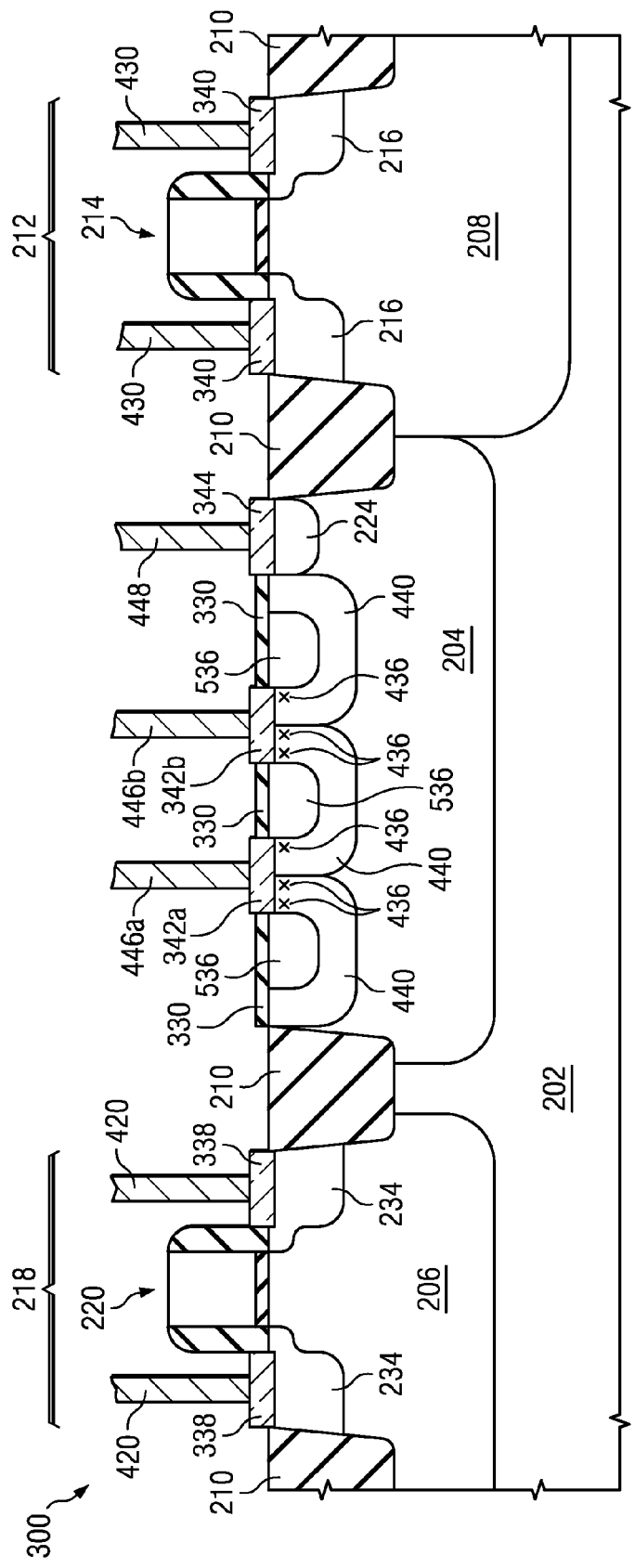
FIG. 3 is a section view of a modified embodiment of the diode of fabricated as shown in FIGS. 2A-2E.

FIG. 3 illustrates a modified embodiment of a Schottky diode comprising a plurality of anodes 342, a cathode 204 and a p-type region 536 annularly laterally encircling the respective anodes 342, implemented on an integrated circuit 300 containing NMOS and PMOS transistors 212, 218. As previously described for integrated circuit 200, the integrated circuit 300 has a semiconductor substrate 202 which contains an n-type cathode region 204, an n-well region 206 and a p-well region 208 isolated by field oxide structures 210. The PMOS transistor 218 is formed in n-well 206 and comprises a gate structure 220, source/drain regions 234, metal silicide regions 338, and contact vias 420. The NMOS transistor 212 is formed in the p-well 208 and comprises a gate structure 214, source/drain regions 216, metal silicide regions 340, and contact vias 430. A silicide blocking dielectric layer 330, typically comprising silicon nitride, is formed on a surface of the n-type cathode region 204, and patterned to define regions for metal silicide formation. The Schottky diode is fabricated by forming a plurality of cobalt silicide ($CoSi_2$) regions 342a, 342b in regions of the n-type cathode region 204 defined by first openings in the silicide blocking dielectric layer 330. The $CoSi_2$ regions 342a, 342b define the plurality of anodes of the Schottky diode, and the n-type region adjacent to the $CoSi_2$ regions 342a, 342b defines a cathode of the diode.

Forming $CoSi_2$ in the anode regions 342a, 342b generates sites 436 in the cathode region that generate leakage current when the diode is operated in reverse bias. A p-type region 536 is formed in the n-type cathode region 204 in the substrate 202 to annularly laterally encircle each anode region 342a, 342b. The p-type region 536 may be formed by fabrication process steps used to form other elements of the integrated circuit 300 such as by fabrication process steps used to form the source/drain regions 234 for the PMOS transistor 218. Depletion regions 440 form around the p-type region 536. As discussed above, this is advantageous because the depletion regions remove charge generated by sites 436 and thus reduce current through the Schottky diode when it is operated in reverse bias.

Metal silicide is prevented from forming in a surface region of the p-type region 536 by the silicide blocking dielectric layer 330, causing the p-type region to be floating. $CoSi_2$ is also formed in a region 344 in the n-type region 224 in the cathode region 204 which has a higher n-type doping than the rest of n-type cathode region 524. Region 344 is defined by a second opening in the silicide blocking dielectric layer 330. The $CoSi_2$ region 344 contacting the n-type region 224 forms an electrical connection to other parts of the integrated circuit 300. Metal contacts 446a, 446b are formed contacting the Schottky diode anodes 342a, 342b, and a metal contact 448 is formed contacting the $CoSi_2$ region 344 connecting to the Schottky diode cathode.

What is claimed is:

1. An integrated circuit including a Schottky diode, comprising:

a cathode defined by an n-type semiconductor region of a substrate;

an anode defined by a silicide region formed at a surface of the n-type semiconductor region;

a p-type region formed in the n-type semiconductor region laterally annularly encircling the silicide region and unconnected by metal interconnect contacts;

an n-type contact region formed in the n-type semiconductor region laterally separated by the p-type region from the silicide region and having a higher n-type doping than the n-type semiconductor region;

a second silicide region formed at a surface of the n-type contact region;

a patterned silicide blocking dielectric layer formed over the surface of the n-type semiconductor region and having first and second openings; the anode defining silicide region being formed at the first opening; the second silicide region being formed at the second opening; and dielectric material of the silicide blocking dielectric layer covering the p-type region;

an n-well formed in the substrate, laterally spaced by an isolation structure from the n-type semiconductor region; a gate structure formed over the n-well; and p-type source/drain regions formed in the n-well on sides of the gate structure;

a p-well formed in the substrate, laterally spaced by an isolation structure from the n-type semiconductor region and from the n-well; a second gate structure formed over the p-well; and n-type source/drain regions formed in the p-well on sides of the second gate structure; and a second anode defined by a third silicide region formed at the surface of the n-type semiconductor region; and wherein the p-type region formed in the n-type semiconductor region also laterally annularly encircles the third silicide region.

2. An integrated circuit including a Schottky diode, comprising:

a cathode defined by an n-type semiconductor region of a substrate;

an anode defined by a silicide region formed at a surface of the n-type semiconductor region; and a p-type region formed in the n-type semiconductor region laterally annularly encircling the silicide region and unconnected by metal interconnect contacts;

a second anode defined by a second silicide region formed at the surface of the n-type semiconductor region; and wherein the p-type region formed in the n-type semiconductor region also laterally annularly encircles the second silicide region.

3. An integrated circuit including a Schottky diode, comprising:

a cathode defined by an n-type semiconductor region of a substrate;

an anode defined by a first silicide region formed at a surface of the n-type semiconductor region; and a p-type region formed in the n-type semiconductor region laterally annularly encircling the first silicide region;

an n-type contact region formed in the n-type semiconductor region laterally separated by the p-type region from the first silicide region and having a higher n-type doping than the n-type semiconductor region;

a second silicide region formed at a surface of the n-type contact region;

a patterned silicide blocking dielectric layer formed over the surface of the n-type semiconductor region and having first and second openings; the first silicide region being formed at the first opening; the second silicide region being formed at the second opening; and dielectric material of the silicide blocking dielectric layer covering the p-type region;

metal contacts respectively formed to contact the first and second silicide regions; the p-type region being uncontacted by a metal contact;

a second anode defined by a third silicide region formed at the surface of the n-type semiconductor region; and wherein the p-type region formed in the n-type semiconductor region also laterally annularly encircles the third silicide region;

wherein depletion regions are defined in the n-type semiconductor region below the first silicide region and around the p-type region.

4. The circuit of 3, wherein the first, second, and third silicide regions comprise cobalt silicide ($CoSi_2$).

5. The circuit of claim 4, further comprising an n-well formed in the substrate, laterally spaced by an isolation structure from the n-type semiconductor region; a gate structure formed over the n-well; and p-type source/drain regions formed in the n-well on sides of the gate structure; and wherein the p-type region encircling the first and third silicide regions is formed simultaneously with formation of the p-type source/drain regions.

* * * * *